US010181857B1

(12) United States Patent
Trifonov (10) Patent No.: US 10,181,857 B1
(45) Date of Patent: Jan. 15, 2019

(54) ANALOG-TO-DIGITAL CONVERTER ERROR CORRECTION (71) Applicant: TEXAS INSTRUMENTS INCORPORATED, Dallas, TX (US)

(72) Inventor: Dimitar T. Trifonov, Vail, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/808,444

(22) Filed: Nov. 9, 2017

Related U.S. Application Data (60) Provisional application No. 62/551,882, filed on Aug. 30, 2017.

(51) Int. Cl.
*H03M 1/12* (2006.01)
*H03M 1/06* (2006.01)
*H03M 3/00* (2006.01)

(52) U.S. Cl.
CPC .......... *H03M 1/0604* (2013.01); *H03M 3/354* (2013.01)

(58) Field of Classification Search
CPC ............................ H03M 1/0604; H03M 3/354
USPC ................................................. 341/155, 120
See application file for complete search history.

(56) References Cited

U.S. PATENT DOCUMENTS

| 7,495,589 | B1 * | 2/2009 | Trifonov | H03M 1/1019 341/118 |
|---|---|---|---|---|
| 9,432,044 | B1 * | 8/2016 | Lee | H03M 1/1061 |
| 9,641,189 | B2 * | 5/2017 | Maddox | H03M 1/1071 |
| 9,667,268 | B2 * | 5/2017 | Girardi | H03M 1/46 |

* cited by examiner

*Primary Examiner* — Brian Young
(74) *Attorney, Agent, or Firm* — John R. Pessetto; Charles A. Brill; Frank D. Cimino (57) ABSTRACT

An analog-to-digital converter includes an integrator, a single comparator, a successive approximation result register, and correction circuitry. The comparator is coupled to an output of the integrator. The successive approximation result register is coupled to an output of the comparator. The correction circuitry is configured to determine whether a sum of a reference voltage and an output voltage of the integrator changes an output of the comparator. The correction circuitry is also configured to, responsive to the sum of the reference voltage and the output of the integrator not changing the output of the comparator, add twice the reference voltage to the output of the integrator to produce a bit value at the output of the comparator, and select a bit value to be loaded into the successive approximation result register based on the bit value at the output of the comparator.

18 Claims, 4 Drawing Sheets

ANALOG-TO-DIGITAL CONVERTER ERROR CORRECTION

CROSS REFERENCE TO RELATED APPLICATION(S)

This application claims priority to U.S. Provisional Application Ser. No. 62/551,882 entitled "Circuit and Method for Redundancy and Error Correction in Cyclic SAR ADC" filed Aug. 30, 2017, and incorporated herein by reference.

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten bit resolution only ten iterations are required, and for twenty bits of resolution only twenty iterations are required.

SUMMARY

Apparatus and methods for correcting errors in a successive approximation register (SAR) analog-to-digital converter (ADC) are disclosed herein. In one embodiment, an ADC includes an integrator, a single comparator, a successive approximation result register, and correction circuitry. The comparator is coupled to an output of the integrator. The successive approximation result register is coupled to an output of the comparator. The correction circuitry is configured to determine whether a sum of a reference voltage and an output voltage of the integrator changes an output of the comparator. The correction circuitry is also configured to, responsive to the sum of the reference voltage and the output voltage of the integrator not changing the output of the comparator, add twice the reference voltage to the output voltage of the integrator to produce a bit value at the output of the comparator, and select a bit value to be loaded into the successive approximation result register based on the bit value at the output of the comparator.

In another embodiment, an ADC includes an integrator, a single comparator, a successive approximation result register, a reference generator, and correction circuitry. The comparator is coupled to an output of the integrator. The successive approximation result register is coupled to an output of the comparator. The reference voltage generator configured to produce a first reference voltage and a second reference voltage. The correction circuitry is configured to determine whether a sum of the first reference voltage and an output voltage of the integrator changes an output of the comparator. The correction circuitry is configured to, responsive to the sum of the first reference voltage and the output voltage of the integrator not changing the output of the comparator, add the second reference voltage to the output voltage of the integrator, double the output voltage of the integrator, and select a bit value to load into the successive approximation result register based on the bit value at the output of the comparator.

In a further embodiment, a method for ADC error correction includes adding a reference voltage to an output voltage of an integrator. The method also includes determining whether a sum of the reference voltage and the output voltage of the integrator changes an output of a comparator that receives the output voltage of the integrator as input. The method further includes, responsive to the sum of the reference voltage and the output voltage of the integrator not changing the output of the comparator, adding the reference voltage to the output voltage of the integrator to produce a bit value at the output of the comparator, and selecting a bit value to load into the successive approximation result register based on the bit value at the output of the comparator.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Successive approximation register (SAR) analog-to-digital converters (ADCs), while efficient, are not without issues. For example, SAR ADCs may make incorrect decisions during the conversion process that cause gross errors in the conversion result. Such decision errors may be caused by noise, insufficient settling time, variation in the comparator threshold, and/or other factors. Some SAR ADCs include additional analog circuitry (e.g., additional comparators, reference generation circuitry, etc.) that can be used to produce information redundancy that allows decision errors to be corrected.

Embodiments of the SAR ADCs disclosed herein include correction circuitry that implements a correction process to correct decision errors without requiring additional analog circuitry. Accordingly, embodiments include a SAR ADC that provides decision correction with lower power and less circuit area than at least some error correcting SAR ADCs.

Figure 1:
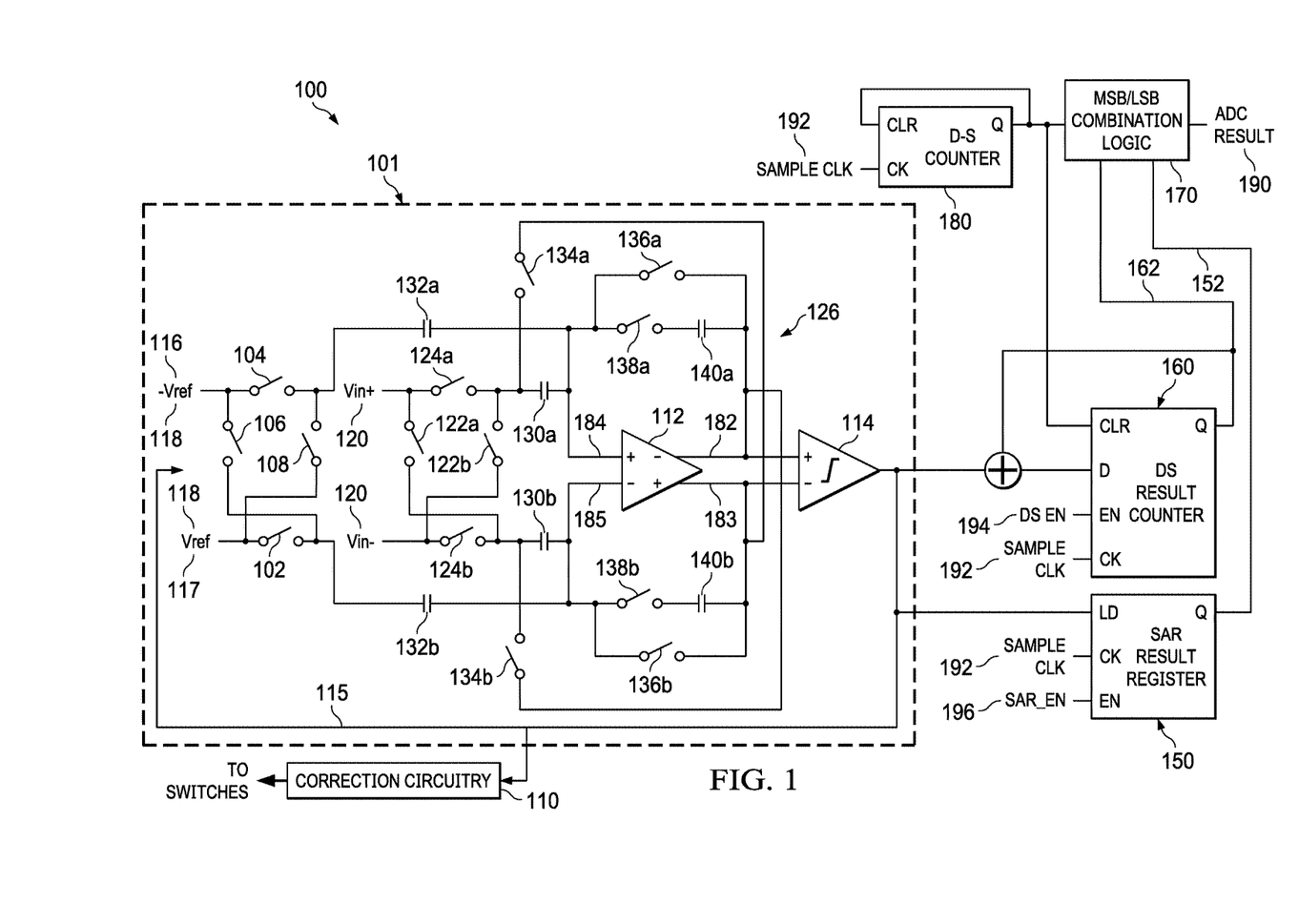
FIG. 1 shows a schematic diagram of an analog-to-digital converter (ADC) that is reconfigurable to operate in delta-sigma or successive approximation mode, and includes circuitry to correct successive approximation errors in accordance with various embodiments.

FIG. 1 shows a schematic diagram of an ADC 100 that is reconfigurable to operate in delta-sigma or successive approximation mode, and includes circuitry to correct successive approximation errors in accordance with various embodiments. The ADC 100 includes a reconfigurable circuit 101 (outlined by a dashed line), a SAR result register 150, a delta-sigma result counter 160, a combination block 170, a sample counter 180, and control and correction circuitry 110.

Reconfigurable circuit 101 includes a differential comparator 114, an integrator 126, and groups of switches that allow for configuration as a delta-sigma ADC or a SAR ADC. When configured as a delta-sigma ADC, delta-sigma result counter 160 tallies the result of the conversion and provides a first portion of a conversion result 162 to combination block 170. Delta-sigma counter 180 is configured to count the appropriate number of samples to be processed while reconfigurable circuit 101 is configured as a delta sigma ADC. As shown, delta-sigma counter 180 is self-resetting once the appropriate number of samples are counted. In some cases, the number of delta-sigma samples is programmable. In such a case, counter 180 may be preloaded with a defined starting count. When the count is achieved, the first portion of the conversion result 162 from delta-sigma result counter 160 is provided to combination block 170, and delta-sigma result counter 160 is reset.

When configured as a SAR ADC, SAR result register 150 receives the successive conversion results and provides a second portion of the conversion result 152 to combination block 170. In some cases, SAR result register 150 places the received result in a bit position corresponding to the magnitude of the result.

Both the first portion of the conversion result 162 and the second portion of the conversion result 152 are provided to combination block 170. Combination block 170 includes circuitry that combines the first portion of the conversion result 162 with the second portion of the conversion result 152 to provide an ADC result 190. In some cases, combination block 170 simply appends the first portion of the conversion result 162 to the second portion of the conversion result 152 with the first portion of the conversion result 162 constituting the most significant bits of ADC result 190, and the second portion of the conversion result 152 constituting the least significant bits of the ADC result 190. In other cases, combination block 170 includes a shift and add function that operates to align the least significant bits of the first portion of the conversion result 162 with the most significant bits of the second portion of the conversion result 152, and thereafter adds the first portion of the conversion result 162 to the second portion of the conversion result 152.

Reconfigurable circuit 101 includes a voltage reference 118 that has a negative polarity voltage reference terminal 116 and a positive polarity voltage reference terminal 117. Both of the aforementioned voltage reference terminals are switched into reconfigurable circuit 101 using switches 102, 104, 106, and 108. It should be noted that various other circuits using fewer switches may be implemented in accordance with one or more embodiments of the present invention that allow for switching positive and negative voltage references into a circuit. Negative voltage reference 116 is electrically coupled to a reference sample capacitor 132a via a switch 104, and to a reference sample capacitor 132b via a switch 106. Positive voltage reference 117 is electrically coupled to reference sample capacitor 132a via a switch 108, and to reference sample capacitor 132b via a switch 102.

A positive side of a differential voltage input 120 is electrically coupled to an input sample capacitor 130a via a switch 124a, and to an input sample capacitor 130b via a switch 122a. A negative side of differential voltage input 120 is electrically coupled to input sample capacitor 130a via a switch 122b, and to input sample capacitor 130b via a switch 124b. In addition, input sample capacitor 130a is electrically coupled to a positive output 183 of a differential operational amplifier 112 via a switch 134a, and input sample capacitor 130b is electrically coupled to a negative output 182 of differential operational amplifier 112 via a switch 134b. The other side of input sample capacitor 130a is electrically coupled to a positive input 184 of differential operational amplifier 112, to negative output 182 via a switch 136a, and to negative output 182 via a switch 138a and an integrating capacitor 140a. The other side of input sample capacitor 130b is electrically coupled to a negative input 185 of differential operational amplifier 112, to positive output 183 via a switch 136b, and to positive output 183 via a switch 138b and an integrating capacitor 140b. Negative output 182 of differential operational amplifier 112 is electrically coupled to a positive input of a differential comparator 114, and positive output 183 is electrically coupled to a negative input of differential comparator 114.

As an overview of the operation of ADC 100, a predetermined amount of samples are taken while ADC 100 is configured for delta-sigma analog-to-digital conversion leaving a residue charge on integrating capacitors 140. The conversion residue on the integrator 126 at the end of a fixed number of cycles is further sampled by configuring ADC 100 as a SAR ADC. Doing such increases resolution without the dramatic increase in conversion time required where a delta-sigma converter is used alone. A recursive SAR ADC is created by disconnecting the input sample capacitors 130 from differential voltage input 120, and reusing the capacitors to create a gain of two on the integrator 126 including differential operational amplifier 112.

Configuring reconfigurable circuit 101 as a delta-sigma ADC includes opening switches 134. While operating as a delta-sigma ADC, switches 124 are closed, switches 122 are opened, switches 136 are closed, and switches 138 are opened. This configuration provides a sample phase where a charge corresponding to differential voltage input 120 is stored on input sample capacitors 130. In the next phase (i.e., the integration phase), switches 124 are opened, switches 122 are closed, switches 136 are opened and switches 138 are closed. This causes the charge from input sample capacitors 130 to transfer to integrating capacitors 140. The aforementioned sample phase and integration phase may be accomplished on succeeding edges (using both positive and negative edges) of a clock, on succeeding negative edges of the clock, or on succeeding positive edges of the clock.

Transferring the charge from input sample capacitors 130 to integrating capacitors 140 results in an output from differential operational amplifier 112 at the input of differential comparator 114. The output of differential operational amplifier 112 is processed by differential comparator 114 to produce either a logic '1' or a logic '0' depending upon positive output 183 of differential operational amplifier 112 relative to negative output 182 of differential operational amplifier 112. Where the result is a logic '0', result counter 160 is not incremented. On the next pass, switches 102, 104, 106, 108 are configured such that voltage reference 118 is not sampled via reference sample capacitors 132 under the direction of feedback 115 (it should be noted that differential voltage input 120 is still sampled on the next pass). Alternatively, on any pass where the result of the comparison is a logic '1', result counter 160 is incremented. It should be noted that incrementing delta-sigma result counter 160 is only enabled when the circuit is operating as a delta-sigma circuit as indicated by DS EN 194, and thus delta-sigma result counter 160 is not incremented by SAMPLE CLK 192 during the SAR operational mode. Further, where the result is a logic '1', switches 102, 104, 106, 108 are configured such that voltage reference 116 differential voltage input is sampled with negative polarity via reference sample capacitors 132 along with 120. Over a number of sampling periods, the digital value representing the voltage at differential voltage input 120 is that maintained on result counter 160.

Increasing the number of samples processed results in a greater resolution on delta-sigma result counter 160. At some point, however, a very large number of iterations are required to gain one additional bit of resolution. For example, approximately one thousand iterations are required to increase from ten to eleven bits of resolution. Thus, in some embodiments, after a certain resolution is achieved (as indicated by delta-sigma sample counter 180) through use of delta-sigma based analog-to-digital conversion, one or more of the switches of reconfigurable circuit 101 are selected such that operation as a SAR ADC is enabled to convert the remaining conversion residue (i.e., the charge remaining on integrating capacitors 140 at the end of operating as a delta-sigma ADC).

Configuring reconfigurable circuit 101 as a SAR based ADC includes closing switches 134, and opening switches 122 and switches 124. While operating as a SAR ADC, the residue charge remaining after the previously described delta-sigma operation is stored on integrating capacitors 140, and differential voltage input 120 is no longer sampled (i.e., switches 122 and switches 124 are opened). Switches 136 are closed causing input sample capacitors 130 to discharge (assuming there is no offset to differential operational amplifier 112). Then, switches 136 are opened and switches 138 are closed while switches 102, 104, 106, and 108 remain open. With switches 138 closed, the remaining charge originally maintained on integrating capacitors 140 is redistributed as differential operational amplifier 112 tries to drive the difference between positive input 184 of differential operational amplifier 112 and negative input 185 to zero.

As previously stated, negative output 182 of differential operational amplifier 112 is electrically coupled to a positive input of a differential comparator 114, and positive output 183 is electrically coupled to a negative input of differential comparator 114. The output of differential comparator 114 is provided to SAR result register 150 that places each output in a particular bit position corresponding to the sample period in which the output corresponds (i.e., which bit the output is to assume in the final result). Further, differential comparator 114 drives feedback 115 that controls switches 102, 104, 106, 108 in the application of the appropriate polarity of voltage reference 118 depending upon the output of differential comparator 114. It should be noted that loading of the SAR result register 150 is only enabled when the circuit is operating as a SAR circuit as indicated by SAR EN 196, and thus the SAR result register 150 is not loaded by SAMPLE CLK 192 during the delta-sigma operational mode.

Once the last bit is derived from reconfigurable circuit 101 operating as a SAR ADC to produce ADC result 190, reconfigurable circuit 101 may again be configured to operate as a delta-sigma ADC. From this point, differential voltage input 120 is again sampled using the delta-sigma ADC, and the residue of that conversion is processed using a SAR analog-to-digital conversion.

The control and correction circuitry 110 controls successive approximation in the ADC 100. The control and correction circuitry 110 performs a bit value determination in series of steps. A "bit value" is the value (0 or 1) of a binary digit (bit). At each step, the control and correction circuitry 110 set the switches of the reconfigurable circuit 101 to cause a specific change in the output of the integrator 126. The outputs of the integrator 126 over the various steps cause the output 115 of the differential comparator 114 to change, and the changes in the output 115 of the differential comparator 114 determine whether a bit value provided by the differential comparator 114 is correct.

Figure 2:
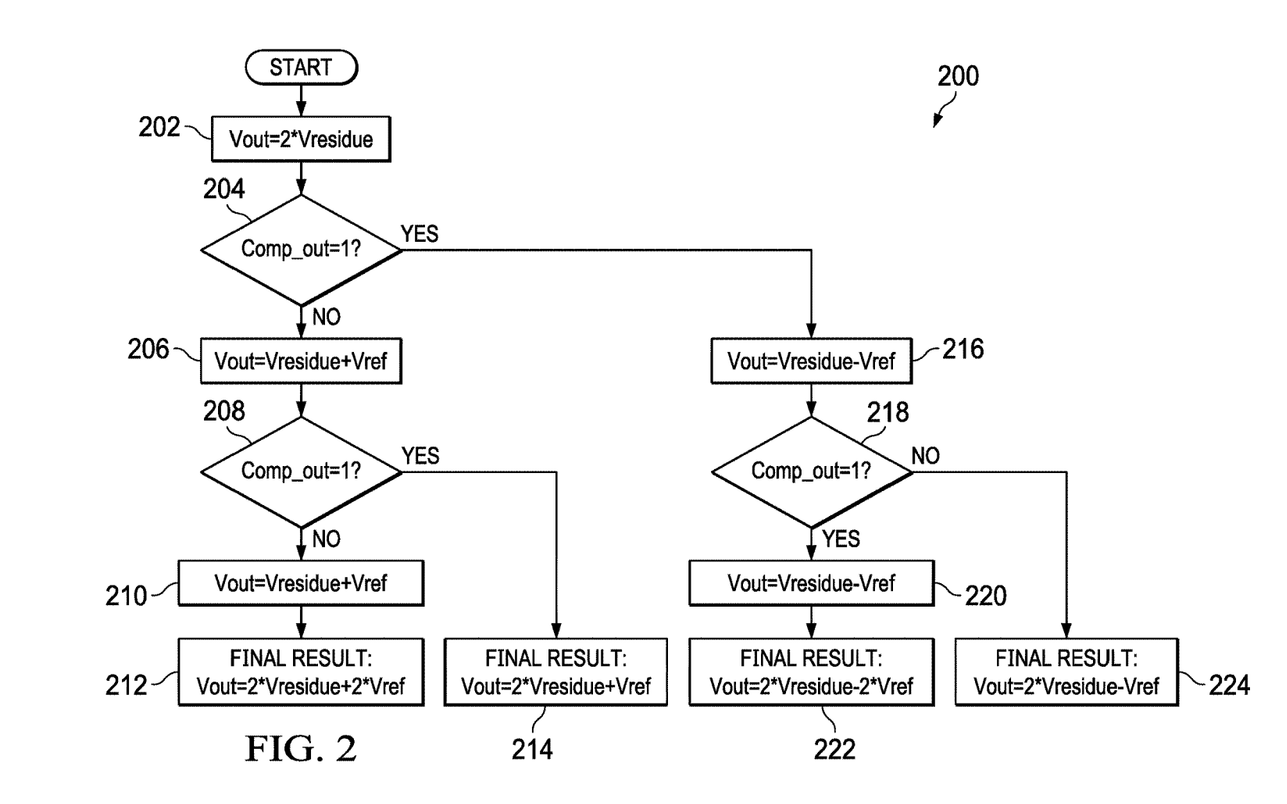
FIG. 2 shows a flow diagram for a method for correcting successive approximation errors in an ADC that applies a unitary reference in accordance with various embodiments.

FIG. 2 shows a flow diagram for a method 200 for correcting successive approximation errors in an ADC that applies a unitary reference in accordance with various embodiments. Though depicted sequentially as a matter of convenience, at least some of the actions shown can be performed in a different order and/or performed in parallel. Additionally, some embodiments may perform only some of the actions shown. The control and correction circuitry 110 may perform the method 200 to correct erroneous bit values produced by successive approximation analog-to-digital conversion. The method 200 may be applied to each bit written into the SAR result register 150.

In block 202, the control and correction circuitry 110 sets the switches of the reconfigurable circuit 101 to double the output of the integrator 126 (the output of the integrator 126 is termed "$V_{residue}$").

In block 204, the control and correction circuitry 110 checks the output 115 of the differential comparator 114 to determine whether the output of the integrator 126 generated in block 202 causes the differential comparator 114 to produce a logic '0' or a logic '1.'

If the output 115 of the differential comparator 114 is a logic '0,' then, in block 206, the control and correction circuitry 110 sets the switches of the reconfigurable circuit 101 to add a reference voltage to the output of the integrator 126 (i.e., to increase the output voltage of the integrator 126 by a reference voltage ($V_{ref}$)).

In block 208, the control and correction circuitry 110 checks the output 115 of the differential comparator 114 to determine whether adding the reference voltage to the output of the integrator 126 caused the output 115 of the differential comparator 114 to switch from a logic '0' to a logic '1.' If the output 115 of the differential comparator 114 is a logic '1,' then determination of the ADC bit value is complete in block 214, the output of the integrator 126 is $2V_{residue}+V_{ref}$.

On the other hand, if in block 208 the output 115 of the differential comparator 114 is a logic '0' (i.e., the output 115 of the comparator 114 did not switch from a logic '0' to a logic '1'), then in block 210 the control and correction circuitry 110 sets the switches of the reconfigurable circuit 101 to add a reference voltage to the output of the integrator 126 (i.e., to increase the output voltage of the integrator 126 by $V_{ref}$). With addition of $V_{ref}$ to the output of the integrator 126, determination of the ADC bit value is complete in block 212, the output of the integrator 126 is $2V_{residue}+2V_{ref}$.

Returning now to block 204, if the output 115 of the differential comparator 114 is a logic '1,' then, in block 216, the control and correction circuitry 110 sets the switches of the reconfigurable circuit 101 to subtract $V_{ref}$ from the output of the integrator 126 (i.e., to decrease the output voltage of the integrator 126 by $V_{ref}$).

In block 218, the control and correction circuitry 110 checks the output 115 of the differential comparator 114 to determine whether subtracting the reference voltage from the output of the integrator 126 cause the output 115 of the comparator 114 to switch from a logic '1' to a logic '0.' If the output 115 of the differential comparator 114 is a logic '0,' then determination of the ADC bit value is complete in block 224, the output of the integrator 126 is $2V_{residue}-V_{ref}$.

On the other hand, if in block 218 the output 115 of the comparator 114 is a logic '1' (i.e., the output 115 of the differential comparator 114 did not switch from a logic '1' to a logic '0'), then in block 220 the control and correction circuitry 110 sets the switches of the reconfigurable circuit 101 to subtract $V_{ref}$ from the output of the integrator 126 (i.e., to decrease the output voltage of the integrator 126 by $V_{ref}$). With subtraction of $V_{ref}$ from the output of the integrator 126, determination of the ADC bit value is complete in block 222, the output of the integrator 126 is $2V_{residue}-2V_{ref}$.

In the blocks 212, 214, 222, and 224 the final output of the integrator 126 may include $+/-V_{ref}$ or $+/-2V_{ref}$. The SAR result register 150 is updated as a function of $V_{ref}$ in the final result of the method 200.

Thus, using the method 200, the ADC 100 can correct errors in successive approximation in two or three operations (cycles). The operations of the method 200 are further described in Table 1 below.

TABLE 1

| | | | | |
|---|---|---|---|---|
| Operation 1 | $2V_{residue}$ | $2V_{residue}$ | $2V_{residue}$ | $2V_{residue}$ |
| Comparator Output | 0 | 0 | 1 | 1 |
| Operation 2 | $2V_{residue}+V_{ref}$ | $2V_{residue}+V_{ref}$ | $2V_{residue}-V_{ref}$ | $2V_{residue}-V_{ref}$ |
| Comparator Output | 0 | 1 | 0 | 1 |
| Operation 3 | $2V_{residue}+2V_{ref}$ | | | $2V_{residue}-2V_{ref}$ |
| Total Result | $2V_{residue}+2V_{ref}$ | $2V_{residue}+V_{ref}$ | $2V_{residue}-V_{ref}$ | $2V_{residue}-2V_{ref}$ |

Figure 3:
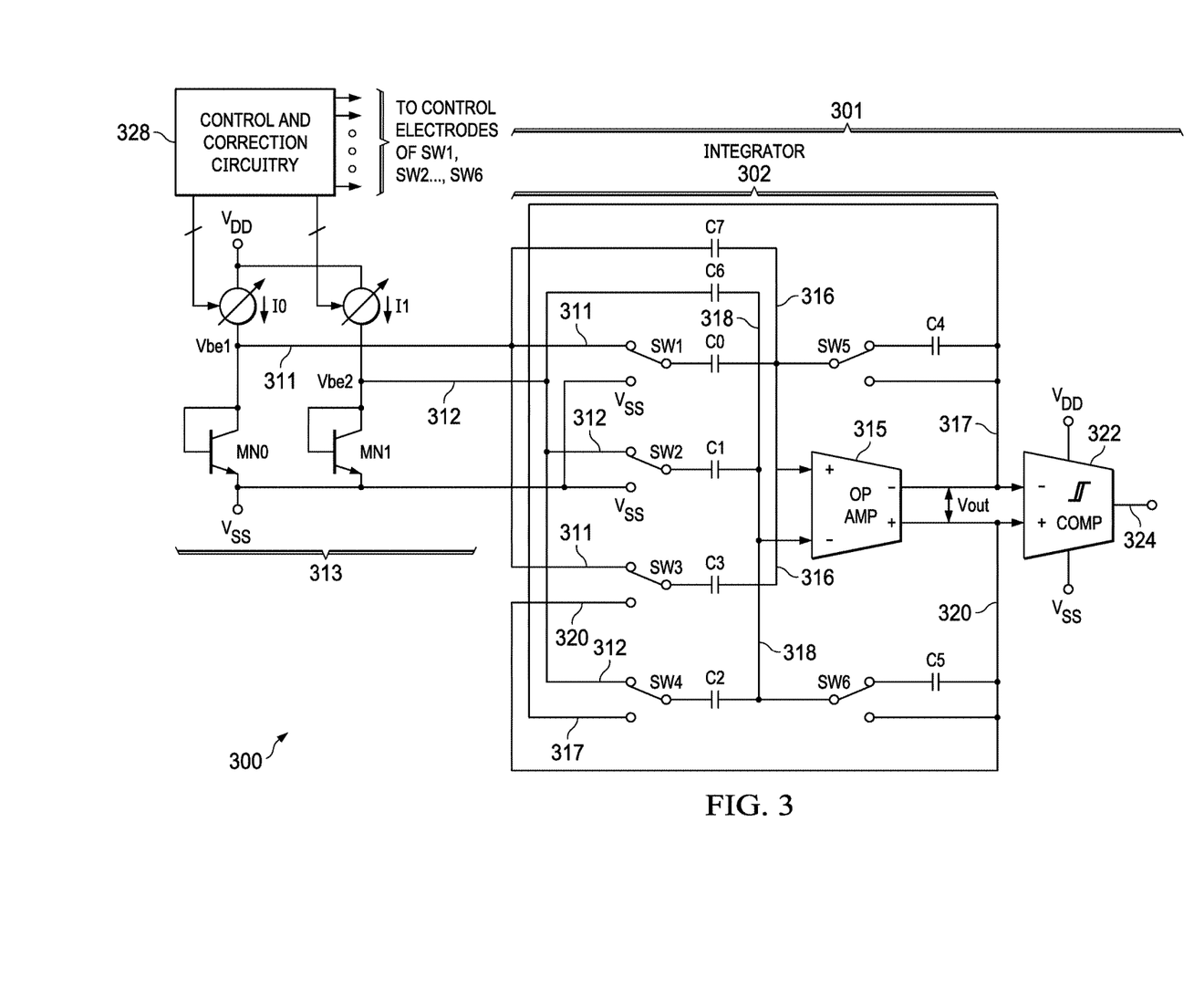
FIG. 3 shows a schematic diagram of integrator and comparator circuitry configured for use in an ADC that is reconfigurable to operate in delta-sigma or successive approximation mode, and includes circuitry to correct successive approximation errors in accordance with various embodiments.

FIG. 3 shows a schematic diagram of integrator and comparator circuitry 300 configured for use in an ADC that is reconfigurable to operate in delta-sigma or successive approximation mode, and includes circuitry to correct successive approximation errors in accordance with various embodiments. The circuitry 300 may be incorporated in an integrated circuit temperature sensor including an analog temperature-sensing input circuit 313 (also referred to as reference voltage generator 313) which generates the input signal ΔVbe for a reconfigurable circuit 301 that may be substituted for reconfigurable circuit 101 in FIG. 1. Controllable current sources I0 and I1 together with diode-connected transistors MN1 and MN2 are used to create the input voltage ΔVbe applied between the inputs 311 and 312 of reconfigurable circuit 301. In accordance with the present invention, controllable current sources I0 and I1 and diode-connected transistors MN1 and MN2 also are used to create a two-part "entire reference voltage" that is equal to the sum of reference voltages ΔVbe and Vbe wherein the two parts are used at separate times.

Circuitry 300 also includes a differential amplifier or operational amplifier 315 having its (−) output coupled by conductor 317 to the (−) input of a comparator 322 and having its (+) output coupled by conductor 320 to the (+) input of comparator 322. Operational amplifier 315 can be the same as or similar to amplifier 112 of FIG. 1, and comparator 322 is a single comparator. The output 324 of comparator 322 can be coupled to delta-sigma result counter 160, SAR result register 150, and MSB/LSB combination logic 170 of FIG. 1.

The (+) input of operational amplifier 315 is coupled by conductor 316 to the pole terminal of single pole, double throw switch SW5 and to one terminal of each of capacitors C0, C3, and C7. The (−) input of operational amplifier 315 is coupled by conductor 318 to the pole of single pole double throw switch SW6 and to one terminal of each of capacitors C2, C1, and C6. One terminal of switch SW5 is coupled to one terminal of a capacitor C4, the other terminal of which is connected to conductor 317. The other terminal of switch SW5 is connected to conductor 317. One terminal of switch SW6 is coupled to one terminal of a capacitor C5, the other terminal of which is connected to conductor 320. The other terminal of switch SW6 is connected to conductor 320.

The second terminal of capacitor C0 is connected to the pole of a single pole, double throw switch SW1, one terminal of which is connected by conductor 311 to the second terminal of capacitor C7. Conductor 311 also is connected to one terminal of switch SW3. Another terminal of switch SW1 is connected to $V_{SS}$. The second terminal of capacitor C1 is connected to the pole of a single pole double throw switch SW2, one terminal of which is connected by conductor 312 to the second terminal of capacitor C6 and one terminal of single pole, double throw switch SW4. Another terminal of switch SW4 is connected to conductor 317. The second terminal of capacitor C2 is connected to the pole of switch SW4. The second terminal of capacitor C3 is connected to the pole of a single pole, double throw switch SW3, one terminal of which is connected by conductor 311 to the second terminal of capacitor C7. The other terminal of switch SW3 is connected to conductor 320.

Conductor 311 is connected to one terminal of a controllable current source I0, the other terminal of which is connected to $V_{DD}$. Conductor 311 also is connected to the collector and base of a transistor MN0, the emitter of which is connected to $V_{SS}$. A voltage $V_{be1}$ is produced on conductor 311 by controllable current source I0 and transistor MN0. Similarly, conductor 312 is connected to one terminal of a controllable current source I1, the other terminal of which is connected to $V_{DD}$. Conductor 312 also is connected to the collector and base of a transistor MN1, the emitter of which is connected to $V_{SS}$. A voltage $V_{be2}$ is produced on conductor 312 by controllable current source I1 and transistor MN1. The transistors MN0 and MN1 may be bipolar junction transistors having a layer of p-type material between two layers of n-type material (NPN).

Each of controllable current sources I0 and I1 can consist of a group of identical current sources and switches that are digitally controlled by a control and correction circuitry 328. Control and correction circuitry 328 controls current sources I0 and I1 and switches SW1-6 so as to effectuate operation of configurable circuit 300 in conjunction with delta-sigma ADC operation and SAR ADC operation of a hybrid delta-sigma/SAR ADC. More specifically, control and correction circuitry 328 allows a single current source to be selected and also allows any number of the identical current sources to be selected in parallel to form controllable current source I0 or I1. This allows the amplitude and polarity of $\Delta V_{be}$ and the amplitude of $V_{be}$ to be determined in response to control and correction circuitry 328 during both the delta-sigma ADC operation phase and the SAR ADC operation phase of ADC 100 of FIG. 1 when it is configured as a temperature controller by replacing reconfigurable circuit 101 of FIG. 1 with reconfigurable circuit 301 of FIG. 3. The various algorithms described herein are executed by means of control and correction circuitry 328, which can be readily implemented by one skilled in the art.

Each of the single pole, double throw switches in FIG. 3 can be implemented by means of a pair of switches, each of which can be implemented by means of a MOS transistor or a complementary metal oxide semiconductor (CMOS) transmission gate. For example, single-pole, double throw switch SW6 in FIG. 3 can be the same as the combination of switches 138b and 136b shown in FIG. 1, each of which can be a metal oxide semiconductor (MOS) transistor or a CMOS transmission gate (which includes a P-channel transistor connected in parallel with an N-channel transistor).

In FIG. 3, control and correction circuitry 328 of reconfigurable circuit 300 determines when and how to control current sources I0 and I1 so as to produce the values of $+\Delta V_{be}$, $-\Delta V_{be}$, and $V_{be}$ as inputs to integrator 302 as needed by the subsequently described "SAR mode algorithm". $\Delta V_{be}$ may be sampled using all of the input capacitors in FIG. 3 because the $\Delta V_{be}$ voltage often is a relatively small voltage, typically a few tens of millivolts, depending on the temperature, the ratio of the currents I0 and I1, and the ratios of the emitter areas of transistors MN0 and MN1, while the $V_{be}$ voltage often is a larger voltage, typically hundreds of millivolts. In order to correctly scale the reference voltage, $\Delta V_{be}$ may be sampled onto more input capacitors than the $V_{be}$ voltage, which may be sampled using only capacitors C0 and C1. That is, the various switches SW1-6 may be configured by control and correction circuitry 328 such that when a $\Delta V_{be}$ voltage is being sampled, all of the input capacitors are used. When a $V_{be}$ voltage is sampled, only capacitors C0 and C1 may be used, with I0 and I1 being set to identical values by means of control and correction circuitry 328. When integrator 302 is configured by control and correction circuitry 328 to multiply the previous residue of integrator 302 by 2, then capacitors C3 and C2, each having a capacitance equal to half that of capacitors C4 and C5, are used. That is, the maximum value of input capacitance is used to sample $\Delta V_{be}$, and the portions of the input capacitance are used as needed to perform other functions, including sampling of $V_{be}$.

The above mentioned capacitance scaling is needed because sampling of the voltage between conductors 311 and 312 involves transfer of charge from the input capacitors used in the sampling to the integrating capacitors C4 and C5, causing a change in the integrator output voltage Vout. If the capacitances of integrating capacitors C4 and C5 are small, the transferred charge will result in an increased magnitude of the change in Vout. (The magnitude of the change in Vout could be reduced by increasing the capacitances of integrating capacitors C4 and C5, but this would result in an undesirable increase in the quiescent current Iq required in order to drive the integrating capacitors.) During sampling operations, either $\Delta V_{be}$ or $V_{be}$ is sampled, and each typically varies between one third of Vref and two thirds of Vref. Integrating capacitors C4 and C5 are scaled so they can receive the transferred charge so as to produce an adequately large value of integrator output Vout that is well below the saturation point of integrator 302.

The input voltage $\Delta V_{be}$ applied by the analog temperature-sensing input circuit 313 between the inputs 311 and 312 of integrator 302 must be digitized by comparison with a reference voltage. However, in the circuit of FIG. 3, there is no existing reference voltage source. In accordance with the present invention, the effect of having a single reference voltage source is provided by creating an "entire reference voltage" Vref by using both the present $\Delta V_{be}=V_{be1}-V_{be2}$ voltage (which is a PTAT voltage i.e., a Proportional to Absolute Temperature voltage) and the present $V_{be}$ voltage, which is equal to the voltage $V_{be1}$ on conductor 311 or $V_{be2}$ on conductor 312 and is negatively proportional to the absolute temperature. More specifically, the entire reference voltage Vref is generated by combining the present $V_{be}$ voltage and the present $\Delta V_{be}$ voltage in a proportion so as to provide either a temperature-independent entire reference voltage or one having a desired temperature dependence.

A sample of $\Delta V_{be}$ is performed as follows. Since the $\Delta V_{be}$ voltage difference between $V_{be1}$ and $V_{be2}$ is much smaller than the $V_{be}$ voltage, all of input capacitors C0-C3 and C6 and C7 may be used to sample $\Delta V_{be}$. For this, sample switches SW1 to SW4 are in the configuration shown in FIG. 3, with $V_{be1}$ coupled to capacitors C0, C3 and C7 and Vbe2 connected to capacitors C1, C2 and C6. The $\Delta V_{be}$ voltage is generated by diode-connected transistors MN1 and MN0. The current in diode-connected transistor MN1 is controlled by control and correction circuitry 328 to be larger or smaller than the current in diode-connected transistor MN0, which creates the $\Delta V_{be}$ voltage equal to $V_{be1}-V_{be2}$ between conductors 311 and 312. During the first half cycle of every cycle of the SAR mode algorithm, switches SW5 and SW6 are switched to connect conductor 316 directly to conductor 317 and also to connect conductor 318 directly to conductor 320 to accomplish zeroing during the first half of every cycle for both delta-sigma ADC operation and SAR ADC operation by means of switches SW5 and SW6. This "zeroing" shorts the corresponding inputs and outputs of operational amplifier 315 and thereby stores the operational amplifier offset voltages on the input capacitors, and thereby zeroes all offset voltages.

The input capacitors connected to conductor 316 are charged to a differential input voltage that is equal to $\Delta V_{be}$ relative to the input capacitors coupled to conductor 318. During the second half cycle of the present cycle, switches SW5 and SW6 are actuated to couple capacitors C4 and C5 as feedback elements of operational amplifier 315. Then the values of current sources I0 and I1 are swapped (i.e., the value of I0 becomes equal to the value of I1 and vice versa during the first half cycle). The ADC input voltage between conductors 311 and 312 then becomes equal in magnitude and opposite in polarity to $\Delta V_{be}$. This change of the input differential voltage from $\Delta V_{be}$ to $-\Delta V_{be}$ causes a charge transfer through the various input capacitors C0, C3 and C7 and input capacitors C1, C2 and C6 and thereby causes the (+) and (−) output voltages of operational amplifier 315 to change and causes the corresponding transferred charges to be stored on integrating capacitors C4 and C5, respectively.

The polarity of the $\Delta V_{be}$ voltage sample thus is determined by controllable current sources I0 and I1. That is, if I0 is relatively small during the first half cycle and is relatively large during the second half cycle, the integrator integrates "$+\Delta V_{be}$". If I0 is relatively large during the first half cycle and relatively small during the second half cycle, the integrator integrates "$-\Delta V_{be}$".

When a $V_{be}$ voltage (rather than a $\Delta V_{be}$ voltage) is sampled, the current sources I0 and I1 are set to be equal, with switches SW3 and SW4 in the configuration shown in FIG. 3. One of the switches SW1 or SW2 is switched to the configuration opposite to that shown in FIG. 3. The capacitors C1 and C0 therefore store a $V_{be}$ differential voltage, and all other input capacitors are at 0 volt differential input level. During the second half cycle switches SW5 and SW6 are released to the configurations illustrated in FIG. 3, and capacitors C4 and C5 are connected as feedback of operational amplifier 315. Then switches SW1 and SW2 are actuated so that they exchange their values (i.e., the state of switch SW1 becomes equal to the state of switch SW2 during the first half of the cycle and vice versa). Then the differential voltage on input capacitors C1 and C0 becomes equal to $V_{be}$ but with opposite polarity, i.e., becomes $-V_{be}$. The voltages on conductors 311 and 312 do not change because the currents in current sources I0 and I1 do not change. The change of the input differential voltage on capacitors C1 and C0 from $+V_{be}$ to $-V_{be}$ causes a charge transfer through capacitors C1 and C0. This causes the (+) and (−) output voltages of operational amplifier 315 to change and causes the corresponding charges to be transferred onto integrating capacitors C4 and C5, respectively. The polarity of the $V_{be}$ voltage sample is determined by the sequence of actuating switches SW1 and SW2. That is, if switch SW1 is switched to $V_{SS}$ during the first half of the cycle and to conductor 311 during the second half cycle, integrator 302 integrates "$+V_{be}$". If SW1 is switched to conductor 311 during the first half of the cycle and to $V_{SS}$ during the second half of the cycle, then integrator 302 integrates "$-V_{be}$".

When a multiplication by 2 is needed in the SAR mode algorithm, switches SW3 and SW4 are actuated so that capacitor C3 is connected as a positive feedback element between the (+) input and the (+) output of operational amplifier 315, and so that capacitor C2 is connected as a positive feedback element between the (−) input and the (−) output of operational amplifier 315. In this mode, current sources I0 and I1 are equal, switches SW1 and SW2 are not switched, i.e., they remain in the configuration shown in FIG. 3, and the input capacitors C1, C0, C6 and C7 store no differential input voltage. During the first half of the SAR algorithm, switches SW5 and SW6 are actuated so as to short the corresponding inputs and outputs of operational amplifier 315 and thereby zero all offset voltages. Capacitors C2 and C3 store only the offset voltage of operational amplifier 315. During the second half cycle, switches SW5 and SW6 are actuated so as to connect capacitors C4 and C5 as integrating capacitors of operational amplifier 315. Then the positive feedback in the integrator 302 formed by operational amplifier 315 and capacitors C2 and C3 causes the integrator 302 to increase its output voltage between conductors 317 and 320. If input capacitors C3 and C2 are half the value of input capacitors C4 and C5, then the output of the integrator 302 is doubled (the charge on C4 and C5 is doubled), so the desired multiplication of the integrator residue voltage Vresidue by 2 is performed.

Reconfigurable circuit 300 of FIG. 3, when substituted for reconfigurable circuit 101 in FIG. 1, provides a complete self-contained integrated circuit temperature sensor including a hybrid delta-sigma/SAR ADC. However, that temperature sensor is capable of operating from a substantially lower power supply voltage and uses less integrated circuit chip area than ADC 100 of FIG. 1. When circuit 300 of FIG. 3 is substituted for reconfigurable circuit 101 of FIG. 1 and is configured for delta-sigma ADC operation, delta-sigma result counter 160 of FIG. 1 tallies the result of the conversion for a set number of samples and provides a first portion of a conversion result 162 to combination block 170, as previously described. After a set number of samples processed while reconfigurable circuit 300 is configured as a delta-sigma analog to digital converter, a residue voltage remains on the feedback/integrating capacitors C4 and C5 and therefore remains as the output voltage of integrator 302 in FIG. 3.

For the SAR ADC mode of operation, one additional function, the multiplication by 2, is included. Three or four cycles are utilized to generate each bit in the SAR ADC mode. Reconfigurable circuit 300 of FIG. 3 performs additions and subtractions (i.e., integrations in the positive and negative directions, respectively, of $V_{be}$ or $\Delta V_{be}$, or amplifies the integrator residue (i.e., the voltage remaining on the integrator output) by the factor of 2, in the three or four cycles.

The control and correction circuitry 328 controls successive approximation using the reconfigurable circuitry 300 in the ADC 100. The control and correction circuitry 328 performs a bit value determination in series of steps. At each step, the control and correction circuitry 328 set the switches of the reconfigurable circuit 300 to cause a specific change in the output of the integrator 302. The outputs of the integrator 302 over the various steps cause the output 324 of the comparator 322 to change, and the changes in the output 324 of the comparator 322 determine whether the bit value provided by the comparator 322 is correct.

Figure 4:
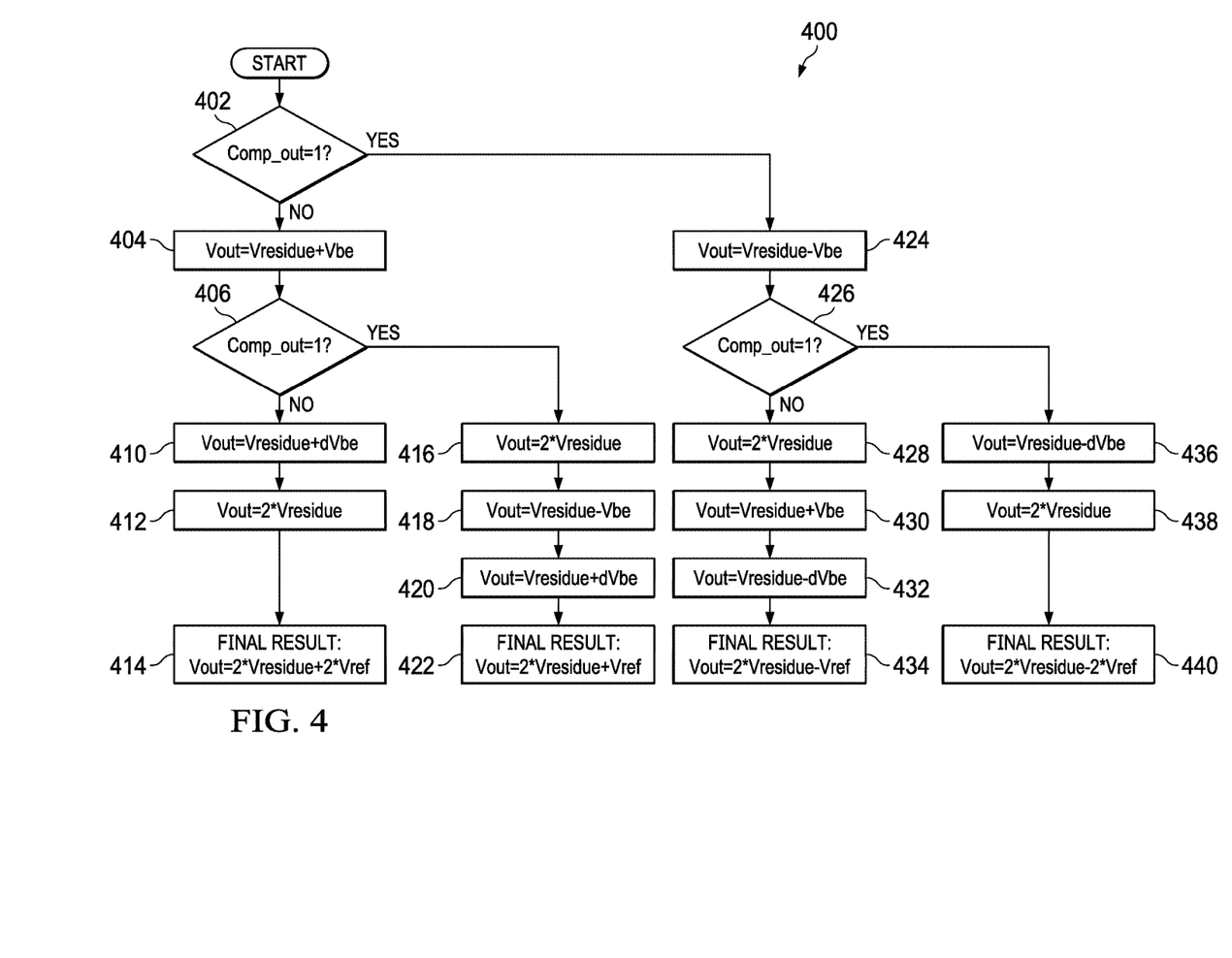
FIG. 4 shows a flow diagram for a method for correcting successive approximation errors in an ADC that applies a split reference in accordance with various embodiments.

FIG. 4 shows a flow diagram for a method 400 for correcting successive approximation errors in an ADC 100 that applies a split reference in accordance with various embodiments. Though depicted sequentially as a matter of convenience, at least some of the actions shown can be performed in a different order and/or performed in parallel. Additionally, some embodiments may perform only some of the actions shown. The control and correction circuitry 328 may perform the method 400 to correct erroneous bit values produced by successive approximation analog-to-digital conversion. The method 400 may be applied to each bit written into the SAR result register 150.

In block 402, the control and correction circuitry 328 examines the output 324 of the comparator 322. If the output 324 of the comparator 322 is a logic "0," then in block 404, the control and correction circuitry 328 sets the switches of the reconfigurable circuit 300 to add $V_{be}$ to the output of the integrator 302 (i.e., to increase the output voltage of the integrator 302 by the partial reference voltage $V_{be}$).

In block 406, the control and correction circuitry 328 checks the output 324 of the comparator 322 to determine whether the output of the integrator 302 generated in block 404 causes the comparator 322 to produce a logic '0' or a logic '1.' If the output 324 of the comparator 322 is a logic '0,' then, in block 410, the control and correction circuitry 328 sets the switches of the reconfigurable circuit 300 to add $V_{be}$ to the output of the integrator 302 (i.e., to increase the output voltage of the integrator 302 by the partial reference voltage $\Delta V_{be}$).

In block 412, the control and correction circuitry 328 sets the switches of the reconfigurable circuit 300 to double the output of the integrator 302 (the output of the integrator 302 is termed "$V_{residue}$"). With the doubling of the output of the integrator 302, determination of the ADC bit value is complete in block 414, and the output of the integrator 302 is $2V_{residue}+2V_{ref}$.

On the other hand, if in block 406 the output 324 of the comparator 322 is a logic '1', then in block 416 the control and correction circuitry 328 sets the switches of the reconfigurable circuit 300 to double the output of the integrator 302.

In block 418, the control and correction circuitry 328 sets the switches of the reconfigurable circuit 300 to subtract $V_{be}$ from the output of the integrator 302 (i.e., to decrease the output voltage of the integrator 302 by the partial reference voltage $V_{be}$).

In block 420, the control and correction circuitry 328 sets the switches of the reconfigurable circuit 300 to add $V_{be}$ to the output of the integrator 302 (i.e., to increase the output voltage of the integrator 302 by the partial reference voltage $\Delta V_{be}$). With the addition of $V_{be}$ to the output of the integrator 302, determination of the ADC bit value is complete in block 422, and the output of the integrator 302 is $2V_{residue}+V_{ref}$.

Returning now to block 402, if the output 324 of the comparator 322 is a logic '1,' then, in block 424, the control and correction circuitry 328 sets the switches of the reconfigurable circuit 300 to subtract $V_{be}$ from the output of the integrator 302 (i.e., to decrease the output voltage of the integrator 302 by the partial reference voltage $V_{be}$).

In block 426, the control and correction circuitry 328 checks the output 324 of the comparator 322 to determine whether the output of the integrator 302 generated in block 424 causes the comparator 322 to produce a logic '0' or a logic '1.' If the output 324 of the comparator 322 is a logic '0,' then, in block 428, the control and correction circuitry 328 sets the switches of the reconfigurable circuit 300 to double the output of the integrator 302.

In block 430, the control and correction circuitry 328 sets the switches of the reconfigurable circuit 300 to add $V_{be}$ to the output of the integrator 302 (i.e., to increase the output voltage of the integrator 302 by the partial reference voltage $V_{be}$).

In block 432, the control and correction circuitry 328 sets the switches of the reconfigurable circuit 300 to subtract $\Delta V_{be}$ to the output of the integrator 302 (i.e., to decrease the output voltage of the integrator 302 by the partial reference voltage $\Delta V_{be}$). With the subtraction of $\Delta V_{be}$ from the output of the integrator 302, determination of the ADC bit value is complete in block 434, and the output of the integrator 302 is $2V_{residue}-V_{ref}$.

On the other hand, if in block 426 the output 324 of the comparator 322 is a logic '1', then in block 436 the control and correction circuitry 328 sets the switches of the reconfigurable circuit 300 to subtract $\Delta V_{be}$ from the output of the integrator 302 (i.e., to decrease the output voltage of the integrator 302 by the partial reference voltage $\Delta V_{be}$).

In block 438, the control and correction circuitry 328 sets the switches of the reconfigurable circuit 300 to double the output of the integrator 302. With the doubling of the output of the integrator 302, determination of the ADC bit value is complete in block 440, and the output of the integrator 302 is $2V_{residue}-2V_{ref}$.

In the blocks 414, 422, 434, and 440 the final output of the integrator 126 may include $+/-V_{ref}$ or $+/-2V_{ref}$. The SAR result register 150 is updated as a function of $V_{ref}$ in the final result of the method 400.

The operations of the method 400 are further described in Table 2 below.

TABLE 2

| Comparator Output | 0 | 0 | 1 | 1 |
|---|---|---|---|---|
| Operation 1 | $V_{residue} + V_{be}$ | $V_{residue} + V_{be}$ | $V_{residue} - V_{be}$ | $V_{residue} - V_{be}$ |
| Comparator Output | 0 | 1 | 0 | 1 |
| Operation 2 | $V_{residue} + V_{be} + \Delta V_{be}$ | $2V_{residue} + 2Vbe$ | $2V_{residue} - 2V_{be}$ | $V_{residue} - V_{be} - \Delta V_{be}$ |
| Operation 3 | $2V_{residue} + 2V_{be} + 2\Delta V_{be}$ | $2V_{residue} + 2V_{be} - V_{be}$ | $2V_{residue} - 2V_{be} + V_{be}$ | $2V_{residue} - 2V_{be} - 2\Delta V_{be}$ |
| Operation 4 |  | $2V_{residue} + V_{be} + \Delta V_{be}$ | $2V_{residue} - V_{be} - \Delta V_{be}$ |  |
| Total Result | $2V_{residue} + 2V_{ref}$ | $2V_{residue} + V_{ref}$ | $2V_{residue} - V_{ref}$ | $2V_{residue} - 2V_{ref}$ |

The above discussion is meant to be illustrative of the principles and various embodiments of the present invention. Numerous variations and modifications will become apparent to those skilled in the art once the above disclosure is fully appreciated. For example, while embodiments of the invention have been described herein in the context of an ADC that is reconfigurable for delta-sigma or successive approximation conversion, those skilled in the art will understand that embodiments are applicable to a wide variety of successive approximation ADCs. It is intended that the following claims be interpreted to embrace all such variations and modifications.

What is claimed is:

1. An analog-to-digital converter (ADC), comprising:
   an integrator;
   a single comparator coupled to an output of the integrator;
   a successive approximation result register coupled to an output of the comparator; and
   correction circuitry configured to:
     determine whether a sum of a reference voltage and an output voltage of the integrator changes an output of the comparator;
     responsive to the sum of the reference voltage and the output voltage of the integrator not changing the output of the comparator, add twice the reference voltage to the output voltage of the integrator to produce a bit value at the output of the comparator; and
     select a bit value to be loaded into the successive approximation result register based on the bit value at the output of the comparator.

2. The ADC of claim 1, wherein the correction circuitry is configured to:
   responsive to the sum of the reference voltage and the output voltage of the integrator changing the output of the comparator, select a bit value to load into the successive approximation result register based on the bit value at the output of the comparator.

3. The ADC of claim 2, wherein the correction circuitry is configured to:
   double the output voltage of the integrator;
   determine whether the doubled output voltage of the integrator sets the comparator output to logic zero; and responsive to the doubled output voltage of the integrator setting the comparator output to logic zero, add the reference voltage to the output voltage of the integrator.

4. The ADC of claim 1, wherein the correction circuitry is configured to:
determine whether a difference of a reference voltage and an output voltage of the integrator changes an output of the comparator;
responsive to the difference of the reference voltage and the output of the integrator not changing the output of the comparator, subtract twice the reference voltage from the output voltage of the integrator to produce a bit value at the output of the comparator, and select a bit value to load into the successive approximation result register based on the bit value at the output of the comparator.

5. The ADC of claim 4, wherein the correction circuitry is configured to subtract twice the reference voltage from the output voltage of the integrator by:
subtracting the reference voltage from the output voltage of the integrator prior to determining whether the difference of the reference voltage and the output voltage of the integrator changes the output of the comparator; and
subtracting the reference voltage from the output voltage of the integrator after determining that the difference of the reference voltage and the output voltage of the integrator fails to change the output of the comparator.

6. The ADC of claim 4, wherein the correction circuitry is configured to:
responsive to the difference of the reference voltage and the output of the integrator changing the output of the comparator, select a bit value to load into the successive approximation result register based on the bit value at the output of the comparator.

7. The ADC of claim 6, wherein the correction circuitry is configured to:
double the output voltage of the integrator;
determine whether the doubled output voltage of the integrator sets the comparator output to logic one; and
responsive to the doubled output voltage of the integrator setting the comparator output to logic one, subtract the reference voltage from the output voltage of the integrator.

8. The ADC of claim 1, wherein the correction circuitry is configured to add twice the reference voltage to the output of the integrator by:
adding the reference voltage to the output voltage of the integrator prior to determining whether the sum of the reference voltage and the output voltage of the integrator changes the output of the comparator; and
adding the reference voltage to the output voltage of the integrator after determining that the sum of the reference voltage and the output voltage of the integrator fails to change the output of the comparator.

9. An analog-to-digital converter (ADC), comprising:
an integrator;
a single comparator coupled to an output of the integrator;
a successive approximation result register coupled to an output of the comparator;
a reference voltage generator configured to produce:
a first reference voltage; and
a second reference voltage; and
correction circuitry configured to:
determine whether a sum of the first reference voltage and an output voltage of the integrator changes an output of the comparator;
responsive to the sum of the first reference voltage and the output voltage of the integrator not changing the output of the comparator:
add the second reference voltage to the output voltage of the integrator;
double the output voltage of the integrator; and
select a bit value to load into the successive approximation result register based on a bit value at the output of the comparator.

10. The ADC of claim 9, wherein the correction circuitry is configured to:
responsive to the sum of the first reference voltage and the output voltage of the integrator changing the output of the comparator:
double the output voltage of the integrator;
subtract the first reference voltage from the output voltage of the integrator;
add the second reference voltage to the output voltage of the integrator; and
select a bit value to load into the successive approximation result register based on the bit value at the output of the comparator.

11. The ADC of claim 9, wherein the correction circuitry is configured to, prior to determining whether the sum of the first reference voltage and the output voltage of the integrator changes an output of the comparator:
determine whether the output voltage of the integrator sets the comparator output to logic zero; and
add the first reference voltage to the output voltage of the integrator based on the output of the comparator being logic zero.

12. The ADC of claim 9, wherein the correction circuitry is configured to:
determine whether a difference of the first reference voltage and the output voltage of the integrator changes an output of the comparator; and
responsive to the difference of the first reference voltage and the output voltage of the integrator not changing the output of the comparator:
subtract the second reference voltage from the output voltage of the integrator;
double the output voltage of the integrator; and
select a bit value to load into the successive approximation result register based on the bit value at the output of the comparator.

13. The ADC of claim 12, wherein the correction circuitry is configured to:
responsive to the difference of the first reference voltage and the output voltage of the integrator changing the output of the comparator:
double the output voltage of the integrator;
add the first reference voltage to the output voltage of the integrator;
subtract the second reference voltage from the output voltage of the integrator; and
select a bit value to load into the successive approximation result register based on the bit value at the output of the comparator.

14. The ADC of claim 12, wherein the correction circuitry is configured to, prior to determining whether the difference of the first reference voltage and an output voltage of the integrator changes an output of the comparator:
determine whether the output voltage of the integrator sets the comparator output to logic one; and
subtract the first reference voltage from the output voltage of the integrator based on the output of the comparator being logic one.

15. A method for analog-to-digital converter error correction, comprising:
- adding a reference voltage to an output voltage of an integrator;
- determining whether a sum of the reference voltage and the output voltage of the integrator changes an output of a comparator that receives the output voltage of the integrator as input;
- responsive to the sum of the reference voltage and the output voltage of the integrator not changing the output of the comparator, adding the reference voltage to the output voltage of the integrator to produce a bit value at the output of the comparator, and selecting a bit value to be loaded into a successive approximation result register based on the bit value at the output of the comparator;
- responsive to the sum of the reference voltage and the output voltage of the integrator changing the output of the comparator, selecting a bit value to load into the successive approximation result register based on the bit value at the output of the comparator;
- doubling the output voltage of the integrator; and
- determining whether the doubled output voltage of the integrator sets the comparator output to logic zero;
- wherein adding the reference voltage to the output voltage of the integrator is responsive to the doubled output voltage of the integrator setting the comparator output to logic zero.

16. A method for analog-to-digital converter error correction, comprising:
- adding a reference voltage to an output voltage of an integrator;
- determining whether a sum of the reference voltage and the output voltage of the integrator changes an output of a comparator that receives the output voltage of the integrator as input;
- responsive to the sum of the reference voltage and the output voltage of the integrator not changing the output of the comparator, adding the reference voltage to the output voltage of the integrator to produce a bit value at the output of the comparator, and selecting a bit value to be loaded into a successive approximation result register based on the bit value at the output of the comparator;
- subtracting the reference voltage from the output voltage of the integrator;
- determining whether a difference of a reference voltage and an output voltage of the integrator changes an output of the comparator; and
- responsive to the difference of the reference voltage and the output of the integrator not changing the output of the comparator, subtracting the reference voltage from the output voltage of the integrator to produce a bit value at the output of the comparator, and selecting a bit value to load into the successive approximation result register based on the bit value at the output of the comparator.

17. The method of claim 16, further comprising subtracting the reference voltage from the output of the integrator after determining that the difference of the reference voltage and the output voltage of the integrator fails to change the output of the comparator.

18. The method of claim 16, further comprising:
- doubling the output voltage of the integrator; and
- determining whether the doubled output voltage of the integrator sets the comparator output to logic one;
- wherein subtracting the reference voltage from the output voltage of the integrator is responsive to the doubled output voltage of the integrator setting the comparator output to logic one.

* * * * *